United States Patent [19]
Demler, Jr.
[11] B 3,982,081
[45] Sept. 21, 1976

[54] KEYBOARD ASSEMBLY WITH OVERLAPPED FLEXIBLE PRINTED CIRCUIT CABLE SWITCH

[75] Inventor: Henry William Demler, Jr., Lebanon, Pa.
[73] Assignee: AMP Incorporated, Harrisburg, Pa.

[22] Filed: May 20, 1975
[21] Appl. No.: 579,104
[44] Published under the second Trial Voluntary Protest Program on January 27, 1976 as document No. B 579,104.

Related U.S. Application Data

[63] Continuation of Ser. No. 503,127, Sept. 4, 1974, abandoned.

[52] U.S. Cl. ............ 200/5 R; 200/5 A; 200/159 R; 200/159 B; 200/292; 29/622; 179/90 K; 197/98; 317/101 F
[51] Int. Cl.² ............ H01H 13/70; H05K 1/02
[58] Field of Search ............ 200/1 R, 5, 16 A, 50 C, 200/159 R, 159 A, 159 B, 275, 290, 292, 322–328, 329–331, 340; 179/90 K; 197/98; 235/145 R; 340/365 A, 365 R; 317/101 F; 29/622

[56] References Cited

UNITED STATES PATENTS

| | | | |
|---|---|---|---|
| 3,125,895 | 3/1964 | Ross | 200/5 C X |
| 3,207,862 | 9/1965 | Robbins | 200/50 C X |
| 3,383,487 | 5/1968 | Wiener | 200/292 X |
| 3,472,974 | 10/1969 | McGough | 200/159 R |
| 3,519,766 | 7/1970 | MacKway | 200/325 |
| 3,745,288 | 7/1973 | Reimer | 200/16 A X |
| 3,909,564 | 9/1975 | Scheingold et al. | 200/5 E |

*Primary Examiner*—James R. Scott
*Attorney, Agent, or Firm*—Allan B. Osborne

[57] ABSTRACT

This invention relates to a keyboard switch assembly having a minimal number of components. A flexible printed circuit cable is configured in such a manner so that the flexible printed circuit cable contains complementary overlapping contact points interconnected by printed circuit electrical lines. A spacer plate with apertures corresponding to sets of complementary contact points is interposed between segments of the folded flexible printed circuit cable. A method for making a keyboard switch assembly with a flexible printed circuit multiple switch assembly is disclosed.

4 Claims, 8 Drawing Figures

KEYBOARD ASSEMBLY WITH OVERLAPPED FLEXIBLE PRINTED CIRCUIT CABLE SWITCH

This is a continuation, of application Ser. No. 503,127 filed Sept. 4, 1974 now abandoned.

BACKGROUND OF THE INVENTION

Conventional keyboards such as found on touchtone telephones contain as many as 101 parts including mounting screws, studs and nuts. In addition to these many parts the final assembly requires the bringing together of three major subassemblies. Further, all the work in both subassembly and final assembly must be done by skilled workmen, with such work including countless soldering operations. Obviously the cost of the many parts plus skilled labor is high. Further, as is well known, humans make mistakes which lead to high failure rates of the assembled keyboards.

It is therefore an object of this invention to provide a keyboard having only a few inexpensive parts. As a corollary yet distinct feature, it is an object to provide a keyboard which is extremely simple to assemble and as such, is not subject to misassembly.

Another object of the present invention is to provide a keyboard having integral switch and spring members formed from a single piece of inexpensive non-corrosive plastic material or sheet metal.

It is yet another object of the present invention to provide a keyboard which is exceedingly reliable in operation.

These and other objects, novel features and advantages of the present invention will be readily apparent from the following detailed description of the preferred embodiment.

RELATED APPLICATIONS

The subject matter contained herein is structurally and functionally related to the subject matter contained in U.S. applications Ser. Nos. 446,182 filed Feb. 27, 1974 and now abandoned and 495,709, filed Aug. 8, 1974 now U.S. Pat. No. 3,909,564.

Figure 1:
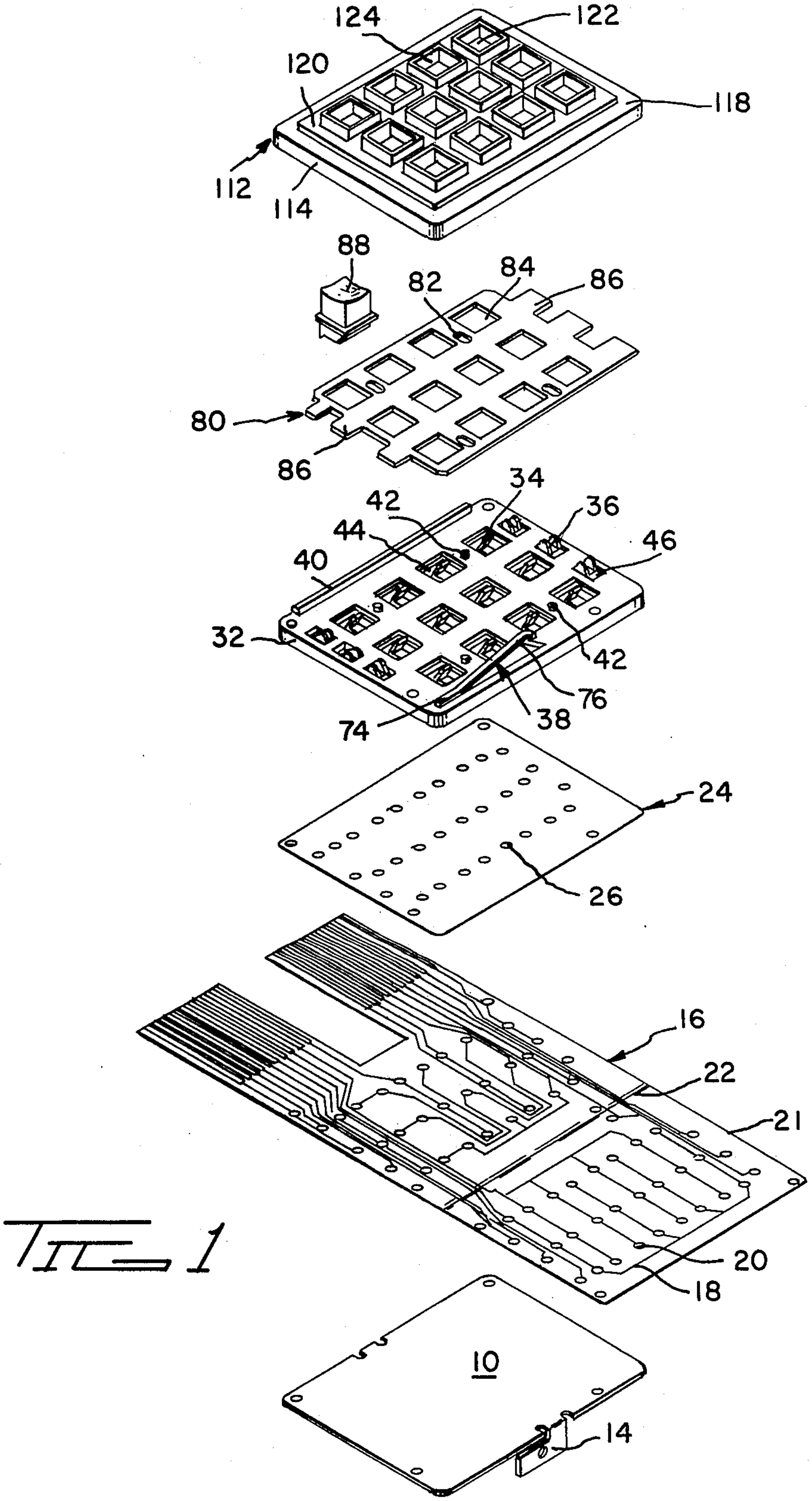
FIG. 1 is an exploded view of the keyboard constructed in accordance with the preferred embodiment of the present invention.
Figure 4:
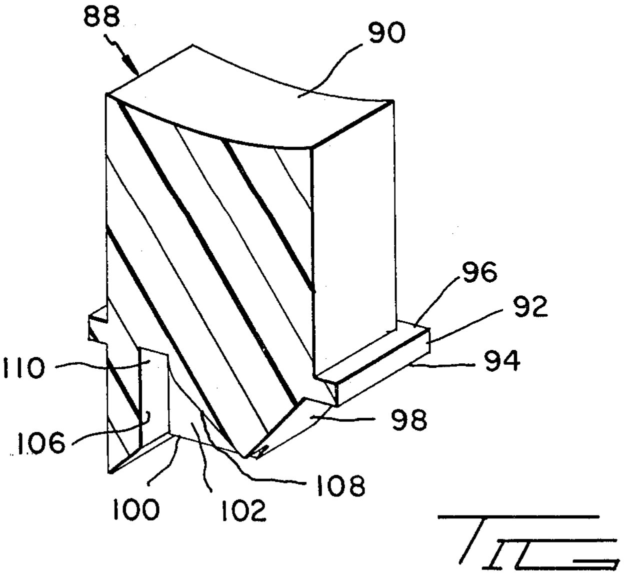
Figure 6:
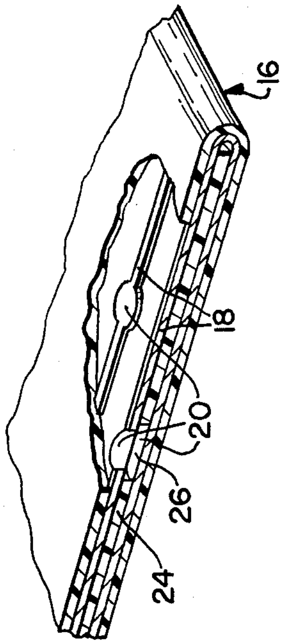
Figure 5:
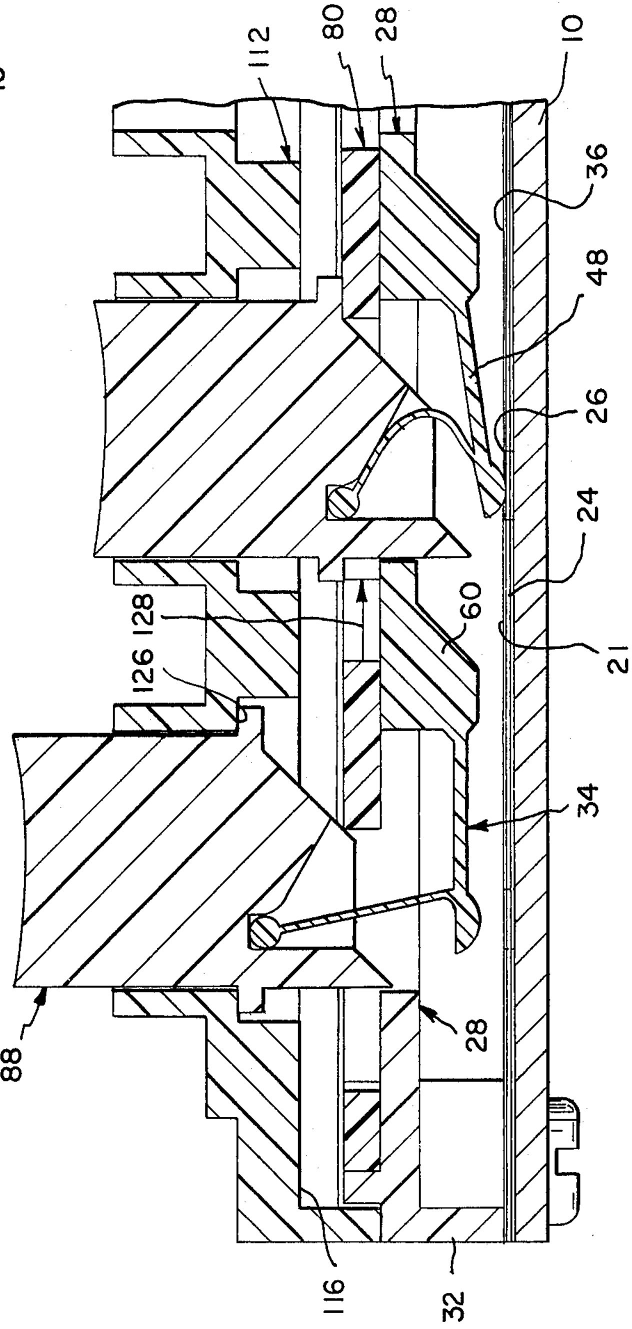

FIGS. *2a* and *2b* illustrate the first spring members of the keyboard;

FIGS. *3a* and *3b* illustrate the second spring members of the keyboard;

FIG. 4 is a cross-sectional view of a key;

FIG. 5 is a cross-sectional view across two keys in the assembled keyboard of FIG. 1; and FIG. 6 is a sectional view of a flat flexible cable folded over a spacer showing the alignment of opposing contacts.

DESCRIPTION OF THE PREFERRED EMBODIMENT

The several elements of the keyboard have been exploded vertically in FIG. 1 to show the details of each element, the relationship of one element to another and also to illustrate the natural, uncomplicated method of assembling the elements to form the keyboard.

The lower most element in FIG. 1 is base plate 10 on which the other elements rest. This plate is preferably made from steel with a chromate conversion coating.

Base plate 10 is made with a pair of downturned tabs 14 which provide one means for fastening the keyboard assembly to a telephone (not shown) or other devices employing a keyboard.

A flat flexible cable 16, shown directly over base plate 10, contains circuit paths 18 and contacts 20 deposited thereon. There are two sets of contacts; and upper contact set positioned at the end portion 21 of the cable and a lower contact set positioned inwardly from the end portion and on the other side of a fold line running normal to the axis of the cable. This fold line is indicated by the reference numeral 22. The two sets of contacts are located on their respective portions of the cable in mirror image relation so that when end portion 21 is folded about fold line 22, the upper contacts are in direct, overlying registration with the lower contacts. When an upper contact touches a lower contact, the particular circuit of which the contacts are part of, closes.

Cable 16 may be made using one of several different film; however a polyimide film sold under the trademark KAPTON by E. I. Dupont de Nemours & Co. is preferred. The circuit paths 18 generally are a deposit of a single layer of copper. The contacts 20 preferably consist of a triple layer of copper, nickle and gold deposited in that order from bottom up.

Cable 16 and its deposited circuit paths and contacts are conventional items available in commerce and do not constitute a novel part of the present invention.

A spacer 24 is shown directly over cable 16. This component is made from a thin sheet of insulating material and contains a set of holes 26 which correspond in number and symmetry with the contact sets. The spacer is positioned between the folded over portions of the cable and as its name implies, its function is to keep the lower contacts separate from the upper contacts absent a biasing force. The holes 26 and the resilience of the material however permit an upper contact to be pushed into physical engagement with a lower contact. Polyester has been found to be a satisfactory material to use.

Spring plate 28, shown directly above spacer 24, rests on top of the outer surface 30 (FIG. 5) of the folded over end portion 21 of cable 16 in the assembled keyboard; i.e., the depending flange 32 extending around the edges of the plate rests on the cable (FIG. 5).

As integral parts of plate 28, there are first spring members 34, second spring members 36, a cam plate return spring 38, a cam plate stop member 40 and cam plate guide studs 42.

First and second spring members 34–36 extend into openings 44 and 46 respectively. As the drawing shows, the former are square and the latter are rectangular with the length thereof being parallel to the sides of the plate.

Referring now to FIGS. *2a*, *2b* and 5, each first spring member 34 consists of a wide horizontal arm 48. Semispherical heads 50*a* and 50*b* depend from the arm at each corner of its free end 52. A vertical arm 54 extends upwardly from the horizontal arm at an angle of about 60° relative thereto. The free end 56 of the vertical arm is rounded to provide bearing 58. The figures show that the horizontal arm 48 extends from a depending step 60 so that that arm is horizontally displaced downwardly a predetermined distance relative to the plate proper.

Figure 3A:
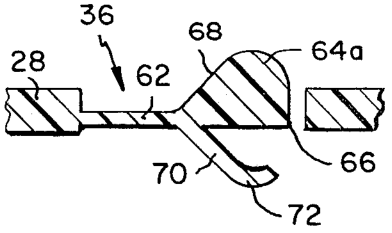
Figure 3B:
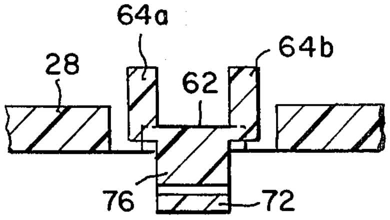

Referring now to FIGS. *3a* and *3b*, each second spring member 36 consists of a horizontal arm 62. Two camming bosses 64*a* and 64*b* project upwardly from the corners of the free end 66 of the arm. The camming surface of each boss is indicated by reference numeral 68 in FIG. 3*a*. A single finger 70 depends obliquely downwardly from the horizontal arm 62. As FIG. 3*b* shows, the finger is positioned between the bosses. The free end of finger 70 is rounded to provide a semi-spherical head 72.

The third moving member on plate 28 is cam plate return member 38. This member has one end 74 integral with the plate 28 and is immovable relative thereto. The remaining portion, hereinafter referred to as spring 76, is considerably longer and is movable in the horizontal plane. Spring 76 provides the biasing force required to return the cam plate 80, seen above plate 28, as will be discussed below.

Cam plate stop member 40 is the upstanding wall extending along the back side of plate 28. Its name is descriptive of its function.

Cam plate guide studs 42 are received in elongated slots 82 in cam plate 80 and restrain the cam plate's lateral motion.

Figure 2A:
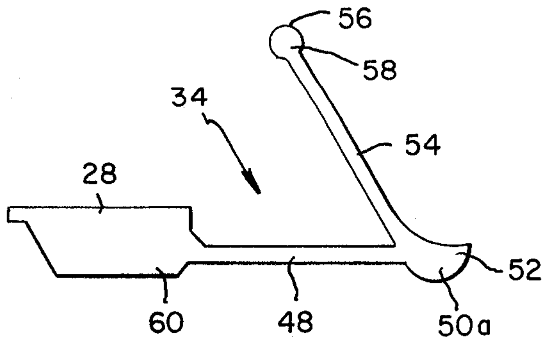
Figure 2B:
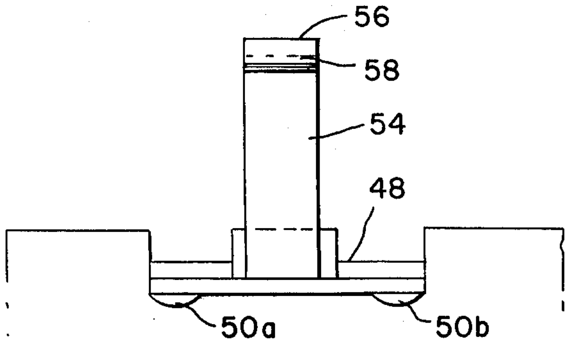

Spring plate 28, its movable parts; i.e., first and second spring members 34 and 36 and cam plate return spring 38, and the non-movable parts; i.e., the stop member 40 and guide studs 42, may be injected molded. If plastic is used, a preferred material is an acetal resin sold under the tradename DELRIN 900 by E. I. Dupont de Nemours & Co., Inc. This material provides exceptional spring performance; the movable parts return readily to the non-stressed positions shown in FIGS. 1, 2 and 3.

Cam plate 80 rests on and slides across the top of spring plate 28, being restrained and guided by the aforementioned stop member 40 and guide studs 42. The cam plate contains a number of openings 84 corresponding in number and spacing to openings 44 in spring plate 28. As is apparent from FIG. 1 the length of cam plate 80 is less than that of spring plate 28 so as to allow the aforementioned sliding movement to be continued within the periphery of the spring plate; i.e., between cam plate return spring 38 and cam plate stop member 40.

Projecting outwardly from each side of cam plate 80 are a series of three ears 86. The ears on one side are staggered or linearly displaced with respect to the ears on the opposite side. The staggered positioning reflects the staggered positioning of the second spring members 36 along either side of spring plate 28. Cam plate 80 is preferably using glass-filled VALOX, a polyester sold under that tradename by General Electric Company.

Keys 88, one of which is positioned above cam plate 80 in FIG. 1 may be better seen in FIG. 4. The top surface 90 of the keys is concave to conformably receive a finger tip as is conventional practice. Also, that surface carries the legend; i.e., letters, a number, both or a symbol.

About two-thirds of the way down from the top surface, a rim 92 encircles the key. The rim provides a downwardly facing shoulder 94 to prevent overtravel of the key and an upwardly facing shoulder 96 which cooperates with confining means to keep the keys on the board. The lower front portion of the key is beveled to provide camming surface 98.

The bottom surface 100 of the key contains a downwardly opening recess 102. Both interior sidewalls 104 and the interior back wall 106 of the recess are vertical while most of the interior front wall 108 is inclined so that the recess is narrowing in one dimension from the bottom upwardly. The wall 108 becomes vertical at the upper portion of the recess to form socket 110 in cooperation with the other three walls. Keys 88 are preferably molded from a clear thermoplastic carbonate-linked polymer made by General Electric Company and sold under the tradename LEXAN.

Referring back to FIG. 1, the last element in the keyboard is a key guide and retaining means; i.e., cover plate 112. A skirt 114 depends from all around the edge of plate 112 to define a downwardly opening cavity 116. This cavity is shown in FIG. 5. The top surface 118 is characterized by having a raised platform 120 and a plurality of openings 122. Each opening is surrounded by guide walls 124 which define downwardly facing shoulders 126. Cover plate 112 is preferably molded from acrylonitrile-butadiene-styrene resins.

FIG. 5 illustrates an assembled keyboard constructed in accordance with the present invention. In assembly, the several elements lend themselves well to fully or semi-automatic handling as no operations other than placing the elements together are required. Further, the elements are all or almost all self-aligning. Although not specifically called out above, the several parts of the keyboard with the exception of the keys and cable contain holes at each corner through which screws or bolts may pass. Obviously, other joining means may also be used. As FIG. 5 suggests, care must be taken in placing keys 88 so that bearings 58 on the first spring members 34 are seated in recesses 110. Also, cam plate 80 must be aligned so that ears 86 thereon are in proper registration with the camming bosses 64*a* and *b* on the second spring members 36.

FIG. 6 shows flat flexible cable 16 folded over spacer 24 such that contacts 20 on one portion of the cable faces the contacts on the other portion. While spacer 24 maintains the separation between opposing contacts, aligned holes 26 therein permit physical contact when a force is applied to the cable in the vicinity of the contacts.

The following steps illustrate one method of assembling the keyboard of the present invention. Cover plate 112 is placed upside down on an appropriate jig (not shown) and keys 88 dropped into the openings 122 in the proper order. Upwardly facing shoulders 96 (now upside down) of the keys rest on cover plate's shoulders 126 and the lower portion of the keys are extending upwardly. Cam plate 80 is placed upside down into cavity 116 of the cover plate 112 with the lower portion of keys 88 protruding up through openings 84 therein. Spring plate 28 is then placed upside down onto the bottom of cam plate 80, care being taken that bearings 58 on the first spring members 34 enter sockets 110 in the recesses in keys 88.

The folded over cable 16, with spacer 24 properly positioned within, is placed on base plate 10 and retained and aligned by screws, bolts or whatever fastening device is used. Then subassembly is turned upside down and placed on top of flange 32 on spring plate 28. The fastening devices are then pushed through the aforementioned corner holes in the spring plate and into a securing relation with the cover plate thereby completing the assembly of the keyboard.

The operation of the keyboard may be described with reference to FIG. 5.

The key on the left hand side of the drawing is in the normal position; i.e., the first spring member 34 is biasing the key 88 upwardly against the cover plates's shoulder 126. The semi-spherical head 50 is spaced above cable 18. The ears 86 on one side of cam plate 80 are positioned adjacent to the bosses 64*a–b* on the second spring members 36 while the ears on the opposite side of the cam plate are resting on the bosses on that side of the assembly. Thus the semispherical heads 72 are pressing down on cable 18 and forcing the upper contacts 20 through holes 26 in the spacer and into direct contact with the lower contacts (not shown). The circuits of which these contacts are part of are obviously closed. Cam plate 80 is backed up against cam plate stop member 40.

The key on the right hand side of the drawing has been fully depressed. During its downward travel, camming surface 98 on the key engaged the wall of opening 84 of cam plate 80 and cammed the plate in a lateral direction forwardly toward cam plate return spring 38 (the direction is indicated by arrow 128 in FIG. 5). As the cam plate moved forward, the ears 86 on one side thereof slid onto bosses 64*a–b* thereby depressing finger 70 — semi-spherical head 72 into contact with cable 18. The upper and lower contacts 22 therebelow engage and those particular circuits are closed. The ears 86 on the opposite side of the cam plate slid off bosses 64*a–b* and allowed the associated finger 70 — semi-spherical heads 72 to return to their non-depressed state away from the cable 16. The contacts underlying those heads 72 were forced away one from the other by the resilient nature of the spacer and those circuits opened. Concurrently the key 88 is depressing the first spring member 34 so that semi-spherical heads 50*a–b* push down on cable 18 and force a pair of adjacent upper contacts through holes 26 and into contact with the lower contacts in alignment therewith; the circuits associated with those contacts close. As the key is further depressed, bearing 58, riding in socket 110, rotates or bends vertical arm 54 against inclined wall 108. In so doing energy which will return the key to its normal position is stored in the first member 34 and further over-travel of semi-spherical heads 50*a–b* is prevented. An additional overtravel preventive is provided by downwardly facing shoulder 94 on rim 92 engaging the surface of cam plate 80 in the rearward side of the opening 84.

In summary the staggered positioning makes contact sequencing possible. This sequencing is essential for a telephone application. Second spring 36 establishes contact only after first spring 34 is actuated and contact is established.

As pressure is removed from a key 88, the energy in the first spring member 34 pushes the key upwardly and lifts semi-spherical heads 50*a–b* off cable 16, thereby letting the spacer separate those particular contacts 20 and opening the associated circuits. Concurrently cam plate return spring 38 pushes the cam plate 80 back against stop member 40. The ears 86 on one side of the cam plate ride off bosses 64*a–b*, opening the underlying contacts while the ears 86 on the other side ride onto bosses 64*a–b* closing those underlying contacts. Each time a key 88 is depressed the above described action occurs.

The nature of the material which is recommended as the preferable material has already been given above in conjunction with each element. The dimensions have not been given because it is obvious the keyboard of the present invention can be made in any size. However, as an aid in practicing the present invention the dimensions in inches for the elements of the keyboard which is used in a touchtone telephone assembly are set out below:

| ELEMENT | WIDTH | LENGTH | THICKNESS |
|---|---|---|---|
| Base plate 10 | 3.325 | 2.550 | 0.060 |
| Cable 16 | 3.000 | — | 0.002 |
| Spacer 24 | 3.325 | 2.550 | 0.005 |
| Spring plate 28 (with flange 32) | 3.325 | 2.550 | 0.200 |
| Cam plate 80 | 3.200 | 2.065 | 0.060 |
| Cover plate 112 | 3.325 | 2.550 | 0.430 |

The overall vertical height of first spring member 34 is 0.340 inches. The same dimensions for the second spring member 36 is 0.190 inches. The width of the first spring members, between the outside surfaces of horizontal arms 48 is 0.410 inches while the same dimension for the second spring members is 0.180 inches (measured between the outside surfaces of bosses 64*a–b*). The thickness of cam plate return spring 38 is 0.050 inches.

As noted above, the keyboard can be made in any size and the dimensions given above are given only as an aid in understanding the present invention and are not to be construed as limiting the invention thereto. Additionally, the foregoing detailed description has been given for clearness of understanding only, and no unnecessary limitations should be understood therefrom, as some modifications will be obvious to those skilled in the art.

What is claimed is:

1. A keyboard assembly comprising:

a. a flat flexible cable with a portion thereof folded back over on itself and having contacts deposited on both facing surfaces, contacts on one surface being directly across from contacts on the other surface;

b. means for connecting the contacts into electrical circuits;

c. a layer of insulating material positioned between the two contact-carrying surfaces and having holes therethrough, said holes being in registration with opposing contacts;

d. a spring plate, overlying the folded over cable and containing a plurality of resilient first spring members, said members being formed from and integral with the plate, each member comprising a horizontal arm with a vertical arm extending obliquely upwardly and with a pair of spaced, semispherical heads on either side projecting downwardly and positioned adjacent an outside surface of the folded over portion of the cable with each head being in direct alignment with a contact located on the inside surface; and e. means for depressing the first spring members such that the horizontal arm rotates about its point of attachment with the plate and the semi-spherical heads push on the cable forcing the aligned contacts through the holes in the insulating material and into electrical engagement with the contacts on the facing surface.

2. The keyboard assembly of claim 1 wherein the means for depressing the first spring members include movable keys having a downwardly opening recess in the bottom surfaces in which is received the vertical arm of the spring member and further having a beveled surface on a side wall thereby providing a camming surface.

3. The keyboard assembly of claim 2 further including:

a. second spring members formed integrally with the spring plate and comprising a horizontal arm having a camming boss projecting upwardly therefrom and a finger extending downwardly with a semi-spherical head on its free end, said head being adjacent an outside surface of the folded over portion of the cable and in direct alignment with a contact located on the inside surface; and b. means for rotating the second spring members about the point of attachment with the spring plate so that the semi-spherical heads push on the cable forcing the aligned contact through a hole in the insulating material and into electrical engagement with a contact on the facing surface.

4. The keyboard assembly of claim 3 wherein the means for rotating the second spring members include a cam plate positioned over the spring plate and having a plurality of slots into which the camming bosses extend and a plurality of openings in which the keys are slidingly positioned so that as a key is depressed, the camming surface on the key moves the cam plate laterally whereby the wall of the slots pushes the camming bosses into a rotational path.

* * * * *